United States Patent
Zhou et al.

(10) Patent No.: US 11,802,739 B2
(45) Date of Patent: Oct. 31, 2023

(54) COOLING ASSEMBLIES HAVING CHANNELS TO SUPPLY FLUID TO WICK STRUCTURES

(71) Applicants: TOYOTA MOTOR ENGINEERING & MANUFACTURING NORTH AMERICA, INC., Plano, TX (US); TOYOTA JIDOSHA KABUSHIKI KAISHA, Aichi-ken (JP)

(72) Inventors: Feng Zhou, Ann Arbor, MI (US); Danny J. Lohan, Ann Arbor, MI (US); Shailesh N. Joshi, Ann Arbor, MI (US); Hitoshi Fujioka, Ann Arbor, MI (US); Shohei Nagai, Aichi-ken (JP); Hiroshi Ukegawa, South Lyon, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 100 days.

(21) Appl. No.: 17/009,246

(22) Filed: Sep. 1, 2020

(65) Prior Publication Data

US 2022/0065549 A1   Mar. 3, 2022

(51) Int. Cl.
*F28D 15/02* (2006.01)
*F28D 15/04* (2006.01)

(52) U.S. Cl.
CPC ....... *F28D 15/0275* (2013.01); *F28D 15/043* (2013.01)

(58) Field of Classification Search
CPC ............... F28D 15/0275; F28D 15/046; F28D 15/0266; F28D 15/043; H05K 7/20309;
(Continued)

(56) References Cited

U.S. PATENT DOCUMENTS 6,397,935 B1 * 6/2002 Yamamoto .......... F28D 15/0233
257/E23.098
6,840,310 B2   1/2005 Tonosaki et al.
(Continued)

OTHER PUBLICATIONS

S. Sudhakar, et al.; "An area-scalable two-layer evaporator wick concept for high-heat-flux vapor chambers"; 2017 16th IEEE Intersociety Conference on Thermal and Thermomechanical Phenomena in Electronic Systems (ITherm); 2017; pp. 537-546.
(Continued)

*Primary Examiner* — Tavia Sullens
*Assistant Examiner* — Khaled Ahmed Ali Al Samiri
(74) *Attorney, Agent, or Firm* — Dinsmore & Shohl LLP

(57) ABSTRACT

A cooling assembly includes a housing defining a fluid chamber, wick structures arranged on an interior surface of the fluid chamber such that one or more flow channels are present therebetween, and a divider. The divider includes an outer frame comprising a first side and a second side and one or more bridging supports extending between and connecting the first side and the second side of the outer frame. The one or more bridging supports are aligned with the one or more flow channels between the wick structures. Each one of the one or more bridging supports define a plurality of vapor flow paths extending therethrough. The one or more bridging supports further define a plurality of vapor spaces between the one or more bridging supports that are aligned with the wick structures. The plurality of vapor flow paths are fluidly coupled to the vapor spaces.

20 Claims, 9 Drawing Sheets

(58) Field of Classification Search
CPC .......... H05K 7/20936; H05K 7/20336; H05K 7/20509; H05K 7/20663; H05K 7/20672; H05K 7/20809; H05K 7/20218
See application file for complete search history.

(56) References Cited

U.S. PATENT DOCUMENTS

| | | |
|---|---|---|
| 7,133,287 B2 | 11/2006 | Campini et al. |
| 7,768,783 B1 | 8/2010 | Kajiya et al. |
| 7,775,261 B2 * | 8/2010 | Valenzuela ......... F28D 15/0233 165/104.21 |
| 8,422,218 B2 | 4/2013 | Fried et al. |
| 8,619,420 B2 | 12/2013 | Degner et al. |
| 10,149,413 B1 * | 12/2018 | Dede .................. H05K 7/20927 |
| 2012/0137718 A1 * | 6/2012 | Uchida .............. H05K 7/20336 62/434 |
| 2014/0318167 A1 * | 10/2014 | Uchida .................... G06F 1/20 62/519 |
| 2019/0393193 A1 | 12/2019 | Eid et al. |

OTHER PUBLICATIONS

Mohammad Reza Shaeri, et al.; "Thin hybrid capillary two-phase cooling system"; https://www.x-mol.com/paper/1222769870831112192; Jan. 2020; 3 pgs.

* cited by examiner

COOLING ASSEMBLIES HAVING CHANNELS TO SUPPLY FLUID TO WICK STRUCTURES

TECHNICAL FIELD

The present specification generally relates to cooling assemblies, and more specifically, to interior components of cooling assemblies that direct fluid flow.

BACKGROUND

Various systems include a combination of power devices, cooling device(s), gate drivers, printed circuit board (PCB), capacitors, and other components. Power devices may be switched on and off in high frequency during operation of the vehicle, generating significant amounts of heat in the process. Adequate cooling of these devices is necessary to ensure proper operation. To this end, cooling assemblies having various component configurations, shapes, and dimensions are contemplated. However, such assemblies have limitations. For example, such assemblies do not ensure that adequate liquid is supplied to and contact surfaces of wick structures arranged on one or more components therein, while limiting the likelihood of flooding of these wick structures to ensure adequate cooling.

SUMMARY

In one aspect, a cooling assembly includes a housing defining fluid chamber, a plurality of wick structures arranged on an interior surface of the fluid chamber such that one or more flow channels are present between wick structures, and a divider. The divider includes an outer frame comprising a first side and a second side and one or more bridging supports extending between and connecting the first side and the second side of the outer frame. The one or more bridging supports are aligned with the one or more flow channels between the plurality of wick structures. Additionally, each one of the one or more bridging supports define a plurality of vapor flow paths extending therethrough. The one or more bridging supports further define a plurality of vapor spaces between the one or more bridging supports that are aligned with the plurality of wick structures. The plurality of vapor flow paths are fluidly coupled to the vapor spaces.

In another aspect, a cooling assembly includes a housing defining a fluid chamber having a first interior surface and a second interior surface facing the first interior surface. The cooling assembly further includes a first plurality of wick structures arranged on the first interior surface of the fluid chamber such that one or more first flow channels are present between first wick structures, and a second plurality of wick structures arranged on the second interior surface of the fluid chamber such that one or more second flow channels are present between second wick structures. The cooling assembly further includes a divider disposed between the first interior surface and the second interior surface of the fluid chamber. The divider includes an outer frame comprising a first side and a second side, and one or more bridging supports extending between and connecting the first side and the second side of the outer frame. The one or more bridging supports are aligned with the one or more first flow channels and the one or more second flow channels. Each one of the one or more bridging supports define a plurality of vapor flow paths extending therethrough.

In yet another aspect, a cooling system includes a power device and a cooling assembly thermally coupled to the power device. The cooling assembly includes a housing defining a fluid chamber, a plurality of wick structures arranged on an interior surface of the fluid chamber such that one or more flow channels are present between wick structures, and a divider. The divider includes an outer frame comprising a first side and a second side. The divider also includes one or more bridging supports extending between and connecting the first side and the second side of the outer frame. The one or more bridging supports are aligned with the one or more flow channels between the plurality of wick structures. Each one of the one or more bridging supports define a plurality of vapor flow paths extending therethrough. The one or more bridging supports further define a plurality of vapor spaces between the one or more bridging supports that are aligned with the plurality of wick structures. The plurality of vapor flow paths are fluidly coupled to the vapor spaces.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
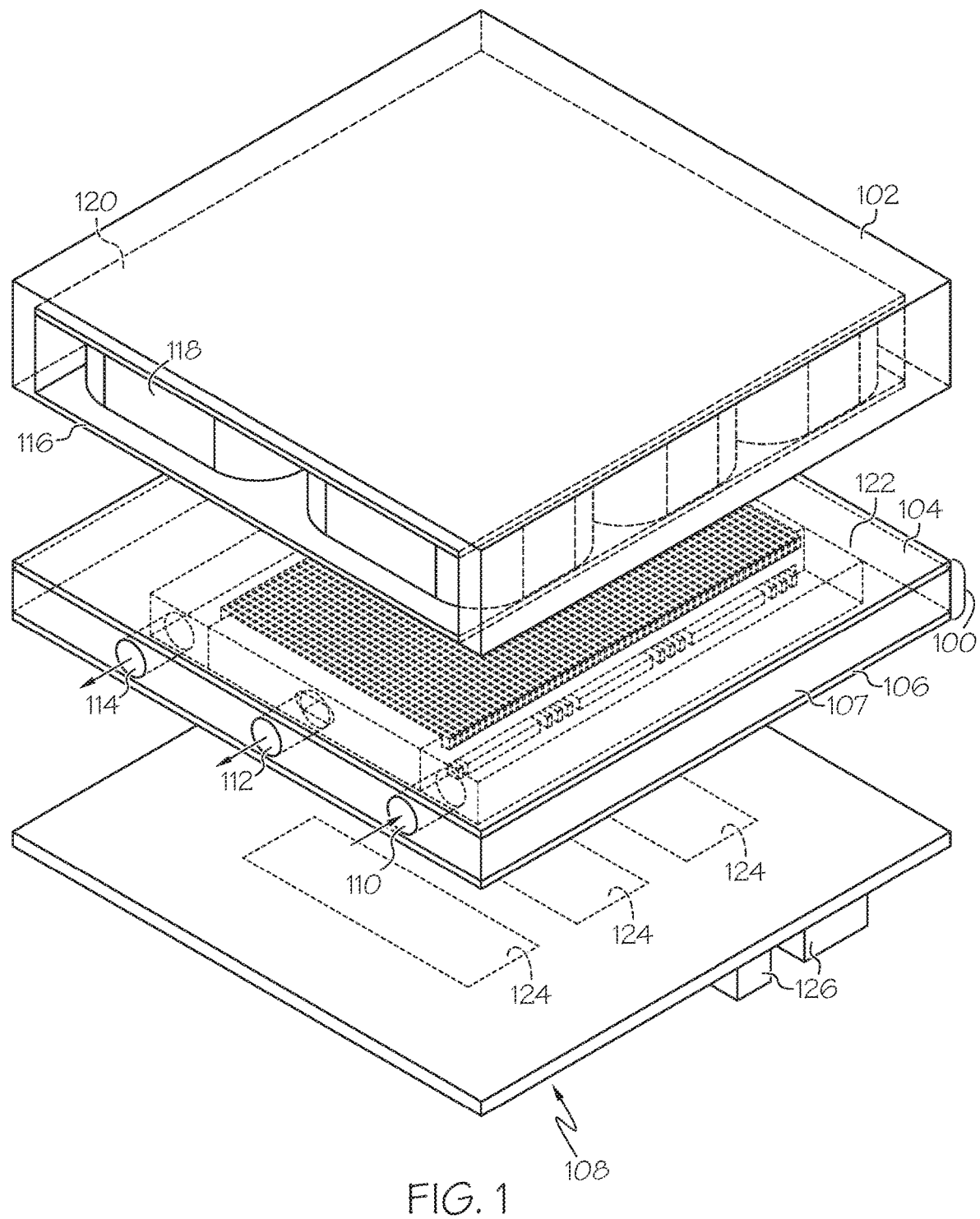
FIG. 1 schematically depicts a cooling assembly such that a surface of the cooling assembly is coupled to a power device embedded in the printed circuit board (PCB) and another surface of the cooling assembly is coupled to an enclosure that includes a capacitor, according to one or more embodiments shown and described herein.

Embodiments of the present disclosure are directed to a cooling assemblies having internal components that direct working fluids to various portions of the wick structures arranged on interior surfaces of the cooling assemblies. In particular, the structure and configuration of the components of the cooling assemblies described herein ensure that a supplied working fluid contacts a plurality of side surfaces of the wick structures, while also reducing the likelihood of flooding of these structures (e.g., due to excess contact with the working fluid). In embodiments, the wick structures absorb the working fluid as the working fluid contacts the side surfaces of the wick structures. The absorbed working fluid then evaporates as vapor from the center areas of these wick structures. Such a phase change also results in efficient absorption of heat present in the cooling assembly (e.g., received from one or more power devices coupled to the assembly). To facilitate this phase change on a regular basis in order to continue heat absorption while ensuring that the wick structures do not dry out, a consistent and efficient supply of working fluid is needed. As such, the cooling assemblies described herein enable the wick structures to more effectively supply the wick structures with working fluid, which increases operational life of one or more power devices coupled to the assembly.

Conventional cooling assemblies include dividers that prevent flooding of wick structures arranged on surfaces of the fluid chamber. These cooling assemblies, however, have limitations. For example, the dividers included in these cooling assemblies may be arranged such that a supply of working fluid coolants that enter these assemblies may contact only a small number of the surfaces of the wick structures (e.g., only the ends of the wick structures), resulting in wick structures that dry out due to high levels of heat. Such heat is typically generated during the operation of the devices with which these wick structures are coupled.

Embodiments described herein address and overcome the limitations of conventional cooling assemblies. Specifically, the embodiments described herein propose improved designs of cooling plates and cooling plate assemblies coupled to or embedded in relation to power devices that are a part of various automotive power electronics and other systems. Various cooling plate assemblies are described herein.

Generally speaking, the embodiments of the cooling assemblies described herein include dividers that are attached to portions of wick structures arranged on one or more surfaces of fluid chambers included in these assemblies. Specifically, these dividers attach to boundaries on the top portions of these wick structures. Such a configuration provides numerous benefits, such as, for example, prevention of the flooding of the wick structures caused by excess contact with working fluids, and ensuring that the working fluids contact all side surfaces of wick structures arranged on one or more surfaces of fluid chambers coupled to these power devices. In this way, the single-phase cooling capabilities and two-phase cooling capabilities of cooling assemblies are enhanced. It is noted that reference will be made interchangeably to FIGS. 1-9 during the explanation of the cooling assemblies described herein.

FIG. 1 schematically depicts a cooling assembly 100 such that a bottom surface 106 of the cooling assembly 100 is coupled to one or more power devices 124 embedded within a printed circuit board (PCB) 108, and a top surface 104 of the cooling assembly 100 is coupled to an enclosure 102 that includes a capacitor 118, according to one or more embodiments shown and described herein. In particular, FIG. 1 depicts the cooling assembly 100 that is disposed between (e.g., sandwiched between) the power devices 124 embedded in the PCB 108 (also referred to as "PCB 108" or "power device embedded PCB 108" herein) and the capacitor 118 included in the enclosure 102. The PCB 108 also includes electronic components 126 that are mounted on a bottom surface of the PCB 108, as depicted in FIG. 1.

The PCB 108 includes both embedded layers and a surface layer having one or more passive components or active components, such as, for example, logic circuits or the like. The one or more passive components or active components may include, but are not limited to, resistors, capacitors, inductors, diodes, oscillators, transistors, integrated circuits, switches, terminals and/or the like. The PCB 108 also includes one or more power conductive layers configured to provide electrical power to and from the power semiconductor devices embedded within the PCB 108. The PCB 108 may include one or more additional copper layers above one or more power conductive layers for signal connections between the components on the top surface and the one or more embedded power semiconductor devices. These layers may be referred to generally as a logic layer.

The PCB 108 may be formed from materials that include any known or yet to be discovered materials, for example, without limitation, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), PTFE (Polytetrafluoroethylene), RF-35 (fiberglass-reinforced ceramics-filled PTFE), alumina, polyimide. The material may be a laminate, cloth or fiber material, resin, silicon, polymer, or the like. The material may be chosen based on the temperature range (e.g., the operating temperature) of the embedded power semiconductor device.

The power devices 124 embedded in the PCB 108 may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the plurality of power semiconductor devices may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power semiconductor devices operate at high current and/or high power (for example, greater than or equal to 40 kW, 50 kW, 60 kW, 70 kW, 80 kW, 90 kW, 100 kW, 110 kW, 120 kW, 130 kW, 140 kW, or 150 kW) and under high temperatures (for example, in excess of 100° C., 150°

C., 175° C., 200° C., 225° C., or 250° C.) and generate a large amount of heat that must be removed for the continued operation of the example power devices (e.g., the power device 124).

Figure 2:
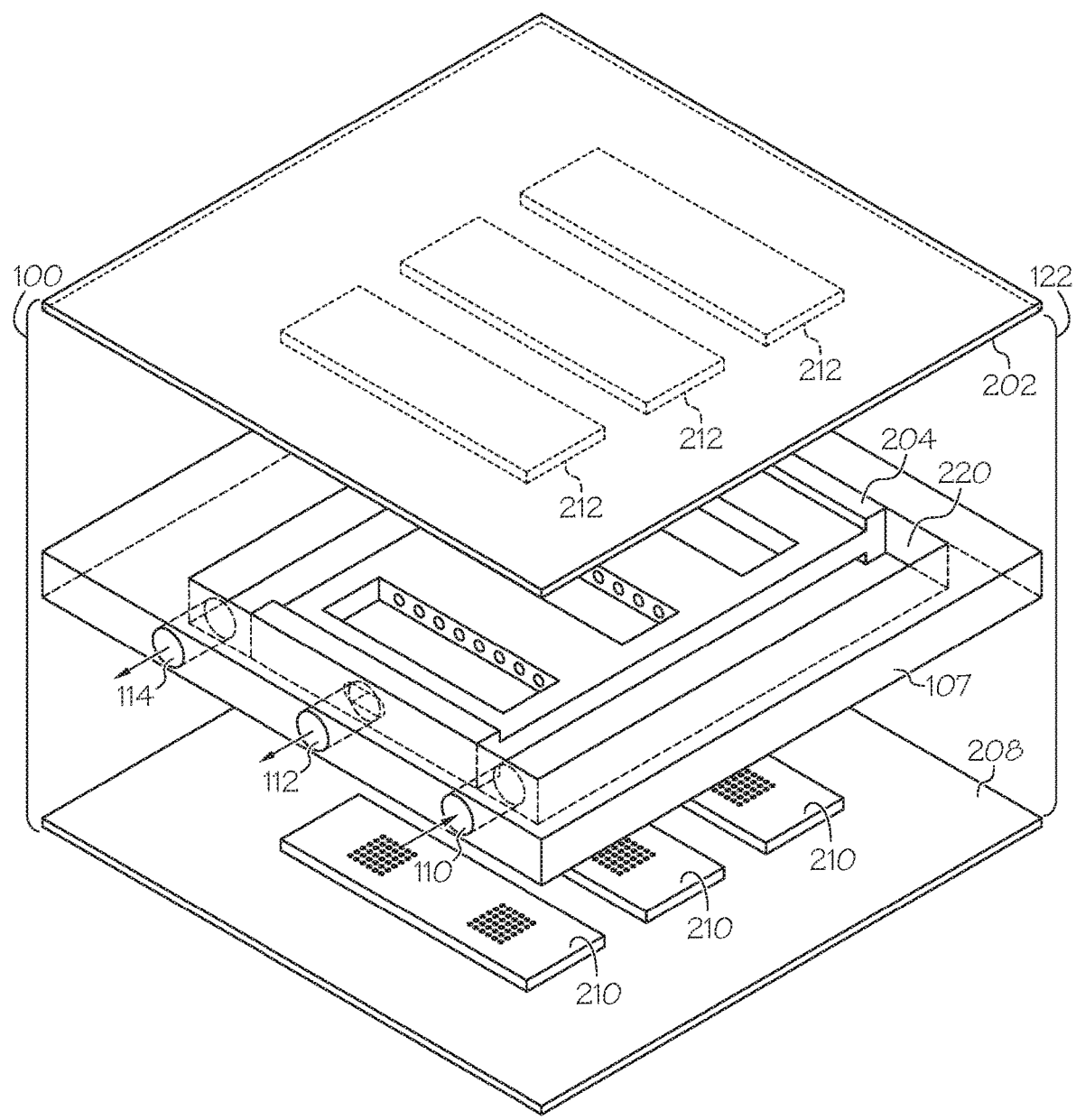
FIG. 2 schematically depicts an exploded view of an example arrangement of a plurality of components included as part of the cooling assembly depicted in FIG. 1, according to one or more embodiments shown and described herein.

Referring to both FIGS. 1 and 2, in some embodiments, the power devices 124 have shapes and dimensions that are similar those of a first plurality of wick structures 210 (depicted in FIG. 2, but not clearly shown in FIG. 1). Additionally, the power devices 124 are embedded in the PCB 108 in locations that correspond to locations on an interior surface of a fluid chamber 122 in which the first plurality of wick structures 210 are arranged such that the power devices 124 are aligned with the wick structures 210.

As depicted in FIG. 1, the cooling assembly 100 is coupled to a particular surface (e.g., a first major surface) of the PCB 108. In embodiments, the cooling assembly 100 includes a housing defining the fluid chamber 122. The fluid chamber 122 corresponds to an area disposed between the top surface 104 and the bottom surface 106 of the cooling assembly 100.

Referring to FIG. 1, the fluid chamber 122 includes a manifold 107 defining an inlet 110 (e.g., a liquid inlet), a first outlet 112 (e.g., a vapor outlet), and a second outlet 114 (e.g., a liquid outlet), and a plurality of wick structures 210 (depicted in FIG. 2, but not clearly shown in FIG. 1) that are arranged on an interior surface (not shown) of the fluid chamber 122. Also as depicted, a bottom surface 106 of the fluid chamber 122 is a two-phase cooling surface and a top surface 104 is a single-phase cooling surface in some embodiments. When single phase cooling occurs within a cooling assembly (e.g., the cooling assembly 100 described herein), liquid enters the inlet 110 at an initial temperature (e.g., 25° C.), travels through the cooling assembly 100, and exits the cooling assembly 100 via the second outlet 114 having a temperature that is higher than the initial temperature (e.g., 80° C.). The increase in temperature is as a result of the thermal capacity of the liquid and its ability to absorb the heat within, e.g., the fluid chamber 122. In embodiments where the cooling assembly 100 is a hybrid cooling assembly having a single phase surface and a two-phase surface, the heat generated due to the operation of the capacitors 118 is cooled by the single phase surface. When two phase cooling occurs within a cooling assembly (e.g., the cooling assembly 100 described herein), some amount of the liquid changes phase into vapor. The liquid to vapor phase change requires a significant amount of heat, which is taken from the heat that is generated due to the operation of the power device 124 embedded in PCB 108. As such, the two-phase cooling is an efficient way of reducing heat generated by the operation of the power device 124. In the embodiment depicted in FIG. 1, the cooling assembly 100 may be a hybrid cold plate. In such an embodiment, interior surfaces of the cooling assembly 100 that have wick structures bonded thereto or arranged thereon that provide two-phase cooling. Alternatively, other embodiments may be single-phase cooling devices that include one interior surface of the cooling assembly 100 that do not include wick structures arranged thereon (e.g., interior surfaces having channels thereon or therein).

Additionally, as depicted in FIG. 1, a bottom surface of the enclosure 102 is coupled to the top surface 104 of the cooling assembly 100. In some embodiments, the bottom surface of the enclosure 102 includes a P-Bus Bar 116 and the top surface of the enclosure includes an N-Bus bar 120. In some embodiments, the enclosure 102 includes the capacitor 118.

FIG. 2 schematically depicts an exploded view of an example arrangement of a plurality of components included as part of the cooling assembly 100 depicted in FIG. 1, according to one or more embodiments shown and described herein. As depicted, the cooling assembly 100 includes the housing defining the fluid chamber 122. The fluid chamber 122 corresponds to an area disposed between the top surface 104 and the bottom surface 106 of the cooling assembly 100. As stated, the cooling assembly 100 may be a hybrid cold plate. In such an embodiment, interior surfaces of the cooling assembly 100 that have wick structures bonded thereto or arranged thereon that provide two-phase cooling. Alternatively, other embodiments may be single-phase cooling devices that include one interior surface of the cooling assembly 100 that do not include wick structures arranged thereon (e.g., interior surfaces having channels thereon or therein). The fluid chamber 122 includes a first cooling surface 208 (e.g., an interior cooling surface) on which the first plurality of wick structures 210 are arranged, and a second cooling surface 202 (e.g., another interior cooling surface) facing the first cooling surface 208 on which a second plurality of wick structures 212 are arranged (depicted in phantom in FIG. 2). The first plurality of wick structures 210 are arranged such that one or more flow channels 422, 424, 426, and 428 are present between the first plurality of wick structures 210. Additionally, the second plurality of wick structures 212 are arranged such that one or more second flow channels 512, 514, 516, and 518 are present between the second plurality of sick structures 212. The cooling surfaces 202 and 208 may be composed of materials such as aluminum or copper. Other materials exhibiting good thermal conductive properties that are comparable to the thermal conductive properties of aluminum or copper are al so contemplated.

In embodiments, the first plurality of wick structures 210 and the second plurality of wick structures 212 may be sintered onto each of the first cooling surface 208 and the second cooling surface 202 respectively. In embodiments, the first plurality of wick structures 210 and the second plurality of wick structures 212 may be formed from copper or a mix of copper and nickel in powder form. Each wick of the first plurality of wick structures 210 and the second plurality of wick structures 212 is capable of absorbing liquid using capillary force and enables phase change of the absorbed liquid into vapor upon, e.g., receiving heat from one or more sources.

As depicted in FIG. 2, the first cooling surface 208 and the second cooling surface 202 may define first and second (e.g., upper and lower) boundaries of the fluid chamber 122 depicted in FIG. 1. Additionally, the fluid chamber 122 includes the manifold 107 disposed within a portion of the fluid chamber 122. The manifold 107 may have a substantially rectangular shape, and define an interior void 220 therein. In embodiments, the interior void 220 may be also have a substantially rectangular or square shape. However, such shapes are merely illustrative and other shapes are contemplated. The manifold 107 may be arranged such that an upper surface of the manifold 107 is arranged in contact with (e.g., bonded to) the second cooling surface 202 and a lower surface of the manifold 107 is arranged in contact with (e.g., bonded to) the first cooling surface 210. Additionally, as stated above, the manifold includes at least one inlet (inlet 110, which may be a liquid inlet), and one or more outlets (the first and second outlets 112 and 114, which may be, e.g., a vapor outlet and a liquid outlet).

The cooling assembly 100 may also include a divider 204 that may be disposed within the interior void 220 of the manifold 107. In embodiments, the divider 204 may be made of rubber, or a material having properties similar to rubber (e.g., materials having similar malleability, tensile strength, and so forth). However, other materials are also contemplated and the present disclosure is not limited to any particular material. The structural significance and functionality of the components of the divider 204 will be described in further detail in the discussion of FIGS. 4-9.

Figure 3:
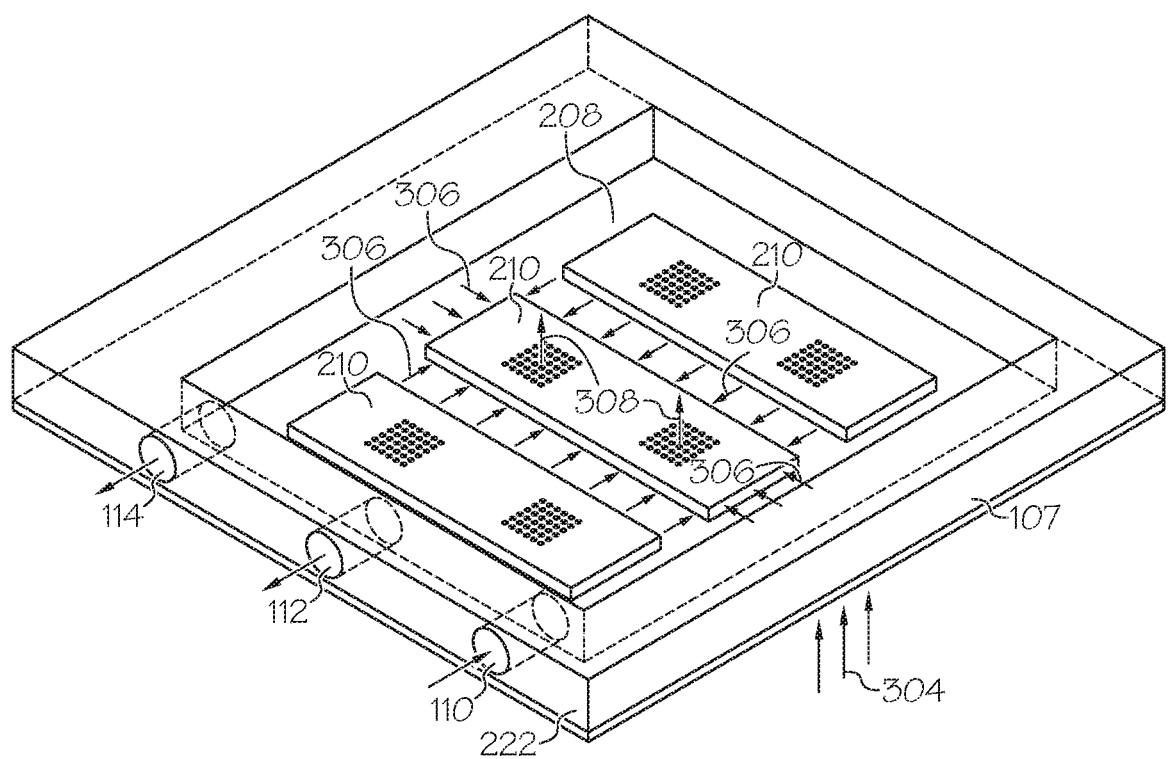
FIG. 3 schematically depicts the manifold, and a plurality of wick structures arranged upon an interior surface of the fluid chamber, according to one or more embodiments shown and described herein.

FIG. 3 schematically depicts the manifold 107, and a plurality of wick structures (e.g., the first plurality of wick structures 210) arranged upon an interior surface (e.g., the first cooling surface 208) of the fluid chamber 122, according to one or more embodiments shown and described herein. The divider 204 is not depicted in FIG. 3.

Figure 4:
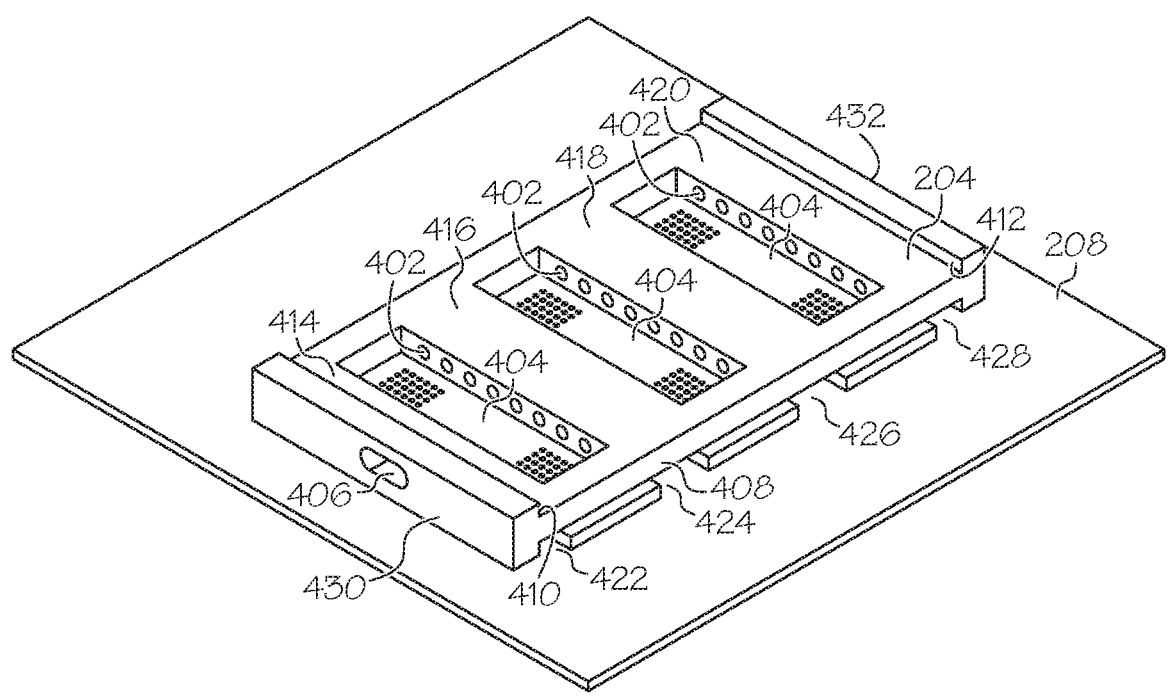
FIG. 4 schematically depicts a perspective view of an illustrative divider arranged in relation to an interior surface of the fluid chamber depicted in FIG. 3, according to one or more embodiments described herein.

In particular, in FIG. 3, the manifold 107 disposed therein in the fluid chamber 122 is depicted. As shown, the first plurality of wick structures 210 are arranged on the first cooling surface 208 of the fluid chamber 122 such that each of the first plurality of wick structures 210 are spaced an equal distance away from each other on the first cooling surface 208. The first plurality of wick structures are arranged on the first cooling surface 208 such that one or more flow channels (e.g., flow channels 422, 424, 426, and 428 as depicted in FIG. 4) are present between the first plurality of wick structures 208. The manifold 107 is shown to be disposed within the fluid chamber 122 such that the first plurality of wick structures 210 occupy a portion of the interior void 220 defined by the manifold 107. Additionally, as stated above, the manifold 107 includes the inlet 110 (e.g., a liquid inlet), the first outlet 112 (e.g., a vapor outlet), and the second outlet 114 an outside end 222 of the manifold 107. Alternatively, another embodiment of the manifold 107 may include a plurality of inlets (e.g., liquid and/or vapor inlets) and a plurality of additional outlets (e.g., vapor outlets). In yet another embodiments, the shapes and dimensions of the plurality of inlets and the plurality of outlets may vary.

In embodiments, heat may be generated as a result of operation of the power device 124 to which the cooling assembly 100 described herein is coupled. Specifically, as depicted in FIG. 1, the power device 124 is thermally coupled to first cooling surface 208 of the cooling assembly 100, and heat that is generated as the result of operation of the power device 124 embedded in the PCB 108 escapes from a surface of the PCB 108 and is absorbed by the first cooling surface 208. For example, during operation of the power device 124, the heat may escape or emanate from the top surface of the PCB 108 and come in contact with the bottom surface the fluid chamber 122. In other words, the heat may be transferred upwards from the top surface of the PCB 108, as indicated by the arrows 304 pointing in the indicated direction, and be absorbed by the bottom surface 106 of the cooling assembly 100. It is noted that, in this arrangement of the cooling assembly 100, as the PCB 108 is arranged underneath the cooling assembly 100, the heat may be transferred from the top surface of the PCB 108 to the bottom surface 106 of the fluid chamber 122 via, e.g., conduction. Due to conduction, heat may be transferred from an initial source of the heat (the PCB 108) to the bottom surface 106 of the cooling assembly 100. Other ways of transferring heat are also contemplated, e.g., convection and radiation.

After the heat is absorbed by or comes in contact with the bottom surface 106 of the cooling assembly 100, the heat may be transferred from the bottom surface of the cooling assembly 100 to one or more of the first plurality of wick structures 210. As a result, a certain amount of coolant present in one or more of the first plurality of wick structures 210 may change phase into vapor, evaporate from the one or more of the first plurality of wick structures 210, and escape from one or more of the first plurality of wick structures 210 as indicated by arrows 308.

Additionally, in embodiments, the working fluid (e.g., water, methanol, ethanol, nanofluids, and/or the like) may flow via the inlet 110 and contact the side surfaces of a particular wick structure of the first plurality of wick structures 210 from a plurality of directions, as indicated by the arrows 306. Specifically, the arrows 306 are depicted as approaching each side surface of one of the first plurality of wick structures 210 from four directions. It is noted that the working fluid may contact the sides surfaces of the others wick structures of the first plurality of wicks structures 210 in a similar manner.

It is noted that the direction in which the working fluid flows, as indicated by the arrows 306 depicted in FIG. 3, is facilitated by the structure of the divider 204 and the orientation, location, and arrangement of the divider 204 within the manifold 107 that is disposed within the fluid chamber 122 of the cooling assembly 100.

FIG. 4 schematically depicts a perspective view of an illustrative divider 204 arranged in relation to an interior surface (e.g., the first cooling surface 208) of the fluid chamber 122 depicted in FIG. 3, according to one or more embodiments described herein. In particular, the divider 204 in FIG. 4 is shown to be arranged on or coupled to a portion of the first plurality of wick structures 210. In particular, the divider 204 is arranged in relation to the first plurality of wick structures 210 on the first cooling surface 208 such that a plurality of areas on the edges of the top surfaces of the first plurality of wick structures 210 are coupled to corresponding areas on the bottom surface of the divider 204.

Structurally, the divider 204 has a substantially rectangular shape and includes an outer frame 408 having a first end support 430, a second end support 432, a first side 410, and a second side 412. The first side 410 and the second side 412 of the outer frame 408 extend between and connect the first end support 430 and the second end support 432 of the frame. The divider may also include a plurality of bridging supports 414, 416, 418, and 420 extending between and connecting the first side 410 and the second side of the outer frame. One or more of the bridging supports 414, 416, 418, and 420 may define a plurality of vapor flow paths 402 extending therethrough. The vapor flow paths 402 may take the form of circular apertures defined in between the bridging supports 414, 416, 418, and 420 (e.g., on the interior side surfaces of the bridging supports 414, 416, 418, and 420).

In addition, the bridging supports 414, 416, 418, and 420 are aligned with the one or more flow channels (e.g., the flow channels 422, 424, 426 and 428 that are present between the first plurality of wick structures 210, and the flow channels 512, 514, 516, and 518 that present between the second plurality of wick structures 212). The bridging supports 414, 416, 418, and 420 have a substantially rectangular shape and are configured as part of the divider 204 such that, in one example, the bridging supports (414, 416, 418, and 420) are connected with one another so as to define a plurality of vapor spaces 404. For example, the divider 204 may be a single piece or strip of rubber (or be made of materials having malleability, tensile strength, and other properties that are similar to rubber) in which a plurality of apertures may be defined between the bridging supports 414, 416, 418, and 420. These apertures correspond to the vapor spaces 404 depicted in FIG. 4. As stated, materials with properties that are comparable to rubber are contemplated. While the vapor spaces 404 depicted in FIG. 4 have a substantially rectangular shape, other shapes are also contemplated. In some embodiments, the vapor spaces 404 may be fluidly coupled to one another via the vapor flow paths 402 extending through the one or more bridging supports 414, 416, 418, and 420. In addition, in some embodiments, one or more of the vapor spaces 404 may be fluidly coupled to a vapor port 406 extending through the first end support 430.

The vapor port 406 may be an aperture within the first end support 430 at a location that corresponds to a location of the first outlet 112 of the manifold 107. In other words, the vapor port 406 is fluidly coupled to the plurality of vapor spaces 404 and the plurality of vapor flow paths 402, and is aligned with the first outlet 112 of the manifold 107 (e.g., a vapor outlet). It is noted that the plurality of vapor flow paths 402 are fluidly coupled to the vapor spaces 404.

It is noted that coolant present in one or more of the first plurality of wick structures 210 that changes phase into vapor as a result of heat that is transferred from the power device 124 embedded in the PCB 108 to the first plurality of wick structures 210, escapes upwards from the first plurality of wick structures 210 and enters the vapor spaces 404. The manner in which the heat is transferred from the power device 124 embedded in the PCB 108 to the first plurality of wick structures 210 is provided in the description of FIG. 3.

In particular, the vapor may enter the vapor spaces 404 and occupy the vapor spaces 404. Thereafter, due to a buildup of pressure caused by the phase change of the coolant to vapor, the vapor flows out of the vapor spaces 404 through the plurality of vapor flow paths 402 that are defined between the bridging supports 414, 416, 418, and 420. After flowing through the plurality of vapor flow paths 402, the vapor, due to the buildup of pressure within the vapor spaces 404 as a result of the phase change of the coolant into vapor, will flow out of the divider 204 via the vapor port 406 defined on the first end support 430.

It is further noted that, when the bottom surface of the divider 204 is coupled to corresponding areas on the edges of the top surfaces of the first plurality of wick structures 210, the vapor spaces 404 align substantially with the top portions of the first plurality of wick structures 210, as depicted in FIG. 4. In other words, a majority of the top portions of the first plurality of wick structures 210 are accessible via the vapor spaces 404, as depicted in FIG. 4. Additionally, due to such a coupling, flow channels 422, 424, 426, and 428 are present in between the first plurality of wick structures 210, and a seal is created between the flow channels 422, 424, 426, and 428 and the top surfaces of the first plurality of wick structures 210 that prevents excess working fluid from flooding the top surface of the first plurality of wick structures 210.

Figure 5:
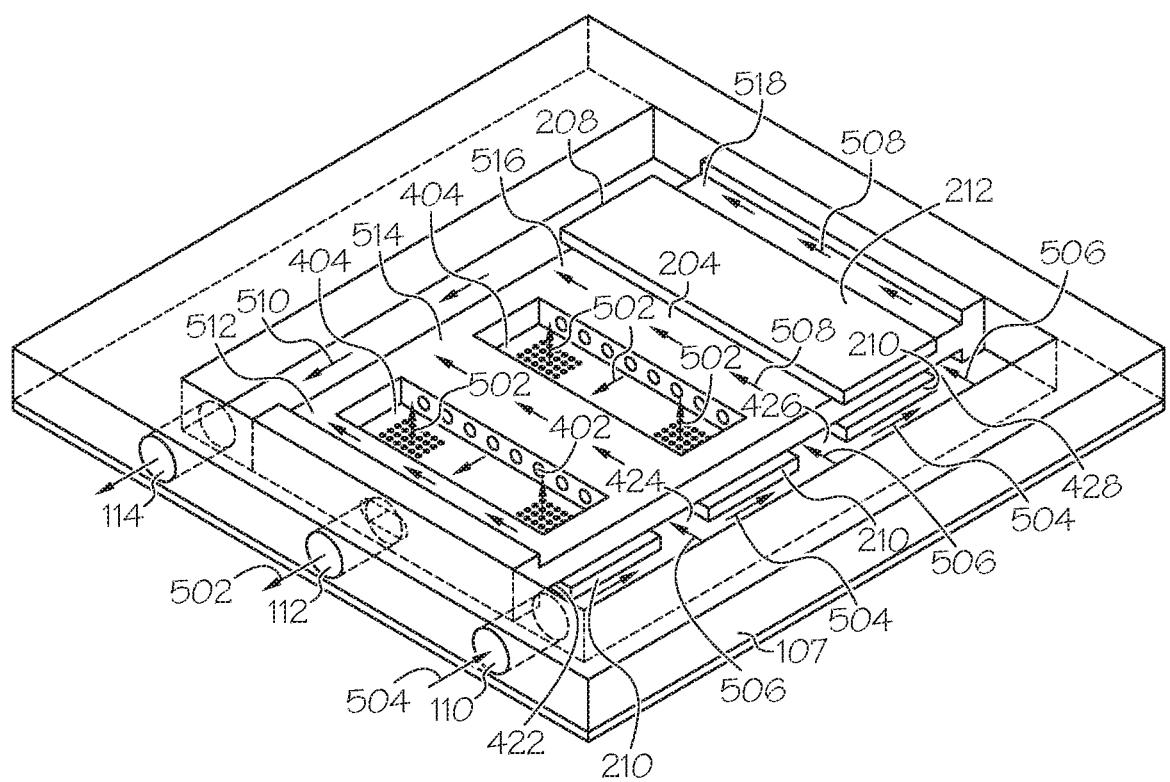
FIG. 5 schematically depicts a perspective view of a divider disposed within an interior void of a manifold that is disposed within the fluid chamber depicted in FIG. 1, with a depiction of the working fluid flow directions, according to one or more embodiments described herein.

FIG. 5 schematically depicts a perspective view of the divider 204 disposed within an interior void 220 of a manifold 107 that is disposed within the fluid chamber 122. FIG. 5 also depicts illustrative working fluid flow directions, according to one or more embodiments described herein. Additionally, the perspective view depicted in FIG. 5 includes one of the second plurality of wick structures 212 depicted in FIG. 2 as being coupled to the divider 204. Specifically, this wick structure is one of the second plurality of wick structures 212 arranged on the second cooling surface 202 depicted in 202. It is noted that the remaining two wick structures in the second plurality of wick structures 212 are not depicted in FIG. 5 for illustrative purposes and to enable convenient explanation and depiction of the directions in which the working fluid flows within the cooling assembly 100. Referring to FIG. 2, the second cooling surface 202 is a bottom surface that corresponds to the surface facing the divider 204 (as depicted in FIG. 2). The second plurality of wick structures 212 are arranged on this surface.

Referring to FIG. 5, one of the second plurality of wick structures 212 shown to be coupled to the divider 204, namely the bridging supports 418 and 420 of the divider 204 shown in FIG. 4. In embodiments, a working fluid flows through the inlet 110 of the manifold 107 within the fluid chamber 122 and onto an interior surface (e.g. the first cooling surface 208) of the fluid chamber 122. Thereafter, the working fluid flows in a plurality of directions (as indicated by arrows pointing in directions 504, 506, 508, and 510) within an area of the fluid chamber 122. After entering the first cooling surface 208, the working fluid flows in the direction 504, which is straight from the inlet 110 to an end of the manifold 107. While flowing in this direction, the working fluid contacts side surfaces of each of the first plurality of wick structures 210. Additionally, the working fluid flows through the flow channels 422, 424, 426, and 428 present between the first plurality of wick structures 210 (e.g., first flow channels), as indicated by the arrows pointing in direction 506. While flowing through these flow channels, the working fluid contacts a different set of side surfaces of the first plurality of wick structures 210, namely the side surfaces that are located underneath the divider 204.

Additionally, the working fluid also flows through flow channels 512, 514, 516, and 518 (e.g., second flow channels) that are present between the second plurality of wick structures 212. It is noted that while flow channel 518 (adjacent to a depicted one of the second plurality of wick structures 212) is readily apparent, the flow channels 512, 514, and 516 are not readily apparent because the remaining wick structures of the second plurality of wick structures 212 have not been depicted in FIG. 5. Specifically, to enable convenience explanation and depiction of the direction in which the working fluid flows within the cooling assembly 100.

However, in an embodiment of the cooling assembly 100 described herein (e.g., the exploded view of the cooling assembly 100 as depicted in FIG. 2), the second plurality of wick structures 212 may be coupled to the top surface of the divider 204 such that the second plurality of wick structures 212 are coupled to areas surrounding the vapor spaces 404 between one or more bridging supports 414, 416, 418, and 420 of the divider 204. In other words, in the embodiment depicted in FIG. 5, two additional wick structures of the second plurality of wick structures 212 (not shown) may be coupled to the areas surrounding the vapor spaces 404 in a manner similar to the depicted one of the second plurality of wick structures 212.

The divider 204 may be aligned with one or more of the flow channels 512, 514, 516, and 518 present between the second plurality of wick structures 212. As the working fluid flows in the direction 508 over a top surface of the divider 204, this working fluid flows through the flow channels 512, 514, 516, and 518 (e.g., second flow channels) present between the second plurality of wick structures 212 arranged on a second interior surface (e.g., second cooling surface 202). It is noted that the second interior surface, which may face the interior surface (e.g., the first cooling surface 208) of the fluid chamber 122, is not explicitly shown in FIG. 5 for convenient explanation and depiction of the directions in which the working fluids may flow.

As the working fluid that flows through the flow channels present between the second plurality of wick structures 212, as indicated by the arrows pointing in direction 508, the working fluid contacts side surfaces of the second plurality of wick structures 212, namely the side surfaces that may be coupled to a top surface of the divider 204. Additionally, the working fluid flowing in the direction 504 (straight from the manifold inlet 214 to an end of the manifold 107) will contact a different set of side surfaces of the second plurality of wick structures 212, namely the side surfaces that are parallel to side surfaces of the first plurality of wick structures 210 coupled to the bottom surface of the divider 204. After flowing in directions 506 and 508, the working fluid exits the area within the fluid chamber 122 that is enclosed by the manifold 107 by flowing in the direction 510. Specifically, the working fluid flows out through the second outlet 114 (e.g., a liquid outlet) of the manifold 107 in the fluid chamber 122. In embodiments, the pressure of a consistent stream of working fluid that flows through the inlet 110 onto the first cooling surface 208 and the second cooling surface 202, results in a certain amount of the liquid in the fluid chamber 122 flowing out of the fluid chamber 122 via the second outlet 114 (e.g., a liquid outlet).

In embodiments, the working fluid (e.g., water, methanol, ethanol, nano fluids, and/or the like) may flow via the inlet 110 and contact the side surfaces of a particular wick structure (the middle wick structure) of the first plurality of wick structures 210 from all directions, as indicated by the arrows 306 in FIG. 3. Specifically, the arrows 306 in FIG. 3 are depicted as approaching each side surface of one (e.g., the middle wick structure) of the first plurality of wick structures 210. The working fluid may contact the remaining wick structures (e.g., the two wick structures that are adjacent to the middle wick structure) in the first plurality of wick structures 210 in a similar way. In other words, the working fluid may flow in flow channels 422, 424, 426, and 428, and as a result, contact a plurality of side surfaces of each of the first plurality of wick structures 210 arranged on the first cooling surface 208.

In short, as the working fluid flows in directions 504, 506, and 508 within the area in the fluid chamber 122, the working fluid contacts all of the side surfaces of the first plurality of wick structures 210 and the second plurality of wick structures 212. Such working fluid contact ensures that these wick structures (first plurality of wick structures 210 and the second plurality of wick structures 212) do not dry out during high power operations of the devices. The consistent supply of working fluid and consistent contact of the working fluid with the side surfaces of the wick structures (first plurality of wick structures 210 and the second plurality of wick structures 212) ensures effective operation of the wick structures, which in turn increases the operational life of the power devices with which the cooling assemblies described herein are coupled.

Additionally, as previously stated, heat may be generated during operation of the powered device 124 embedded in the PCB 108 to which the cooling assembly described herein is embedded. This heat may be transferred from the interior surface (the first cooling surface 208) of the fluid chamber 122 to one or more of the first plurality of wick structures 210. Referring to FIG. 3, the arrows 304 pointing in the indicated direction depicts the direction in which the heat is transferred. Alternatively or additionally, the heat may also be transferred from the capacitor 118, via the enclosure 102 to the second interior surface (the second cooling surface 202) of the fluid chamber 122 (the surface upon which the second plurality of wick structures 212 are arranged) to the second plurality of wick structures 212. It is further noted that heat may be transferrable from both sides of the fluid chamber 122 in addition to the heat that is generated by the operation of the power device 124 embedded in the PCB 108.

Due to this heat transfer, a certain amount of coolant present in the first plurality of wick structures 210 and the second plurality of wick structure 212 changes phase into vapor, which then emanates out of these wick structures (first plurality of wick structures 210 and the second plurality of wick structures 212) and occupies the vapor spaces 404 defined in the divider 204. Referring back to FIG. 5, the direction 502 indicates the manner in which the vapor emanates out of the first plurality of wick structures 210 (e.g., upwards from these wick structures). The emanated vapor then flows out via the vapor flow paths 402 defined in between the one or more bridging supports 414, 416, 418, and 420, through the first outlet 112 (e.g., a vapor outlet) that is disposed in the manifold 107, which is included within the fluid chamber 122.

Figure 6:
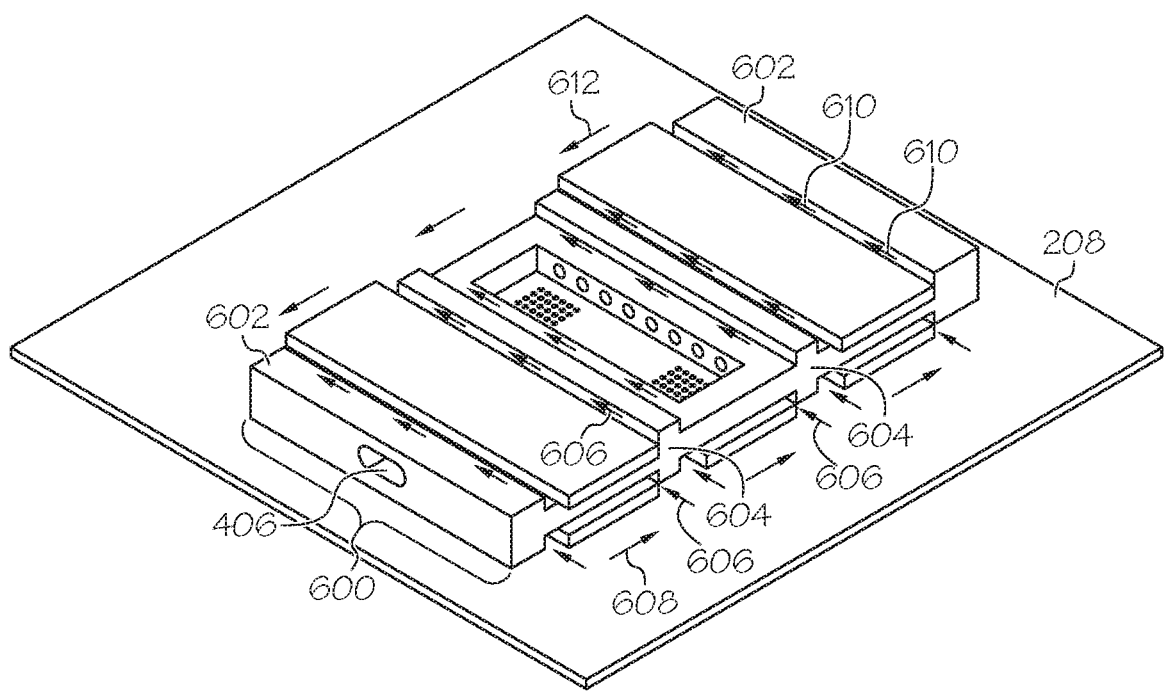
FIG. 6 schematically depicts a perspective view of an embodiment of a divider having a plurality of divider supports that extend from one or more bridging supports of the divider, according to one or more embodiments shown and described herein.

FIG. 6 schematically depicts a perspective view of an embodiment of an exemplary divider 600 having a plurality of exemplary divider supports 604 that extend from one or more bridging supports 414, 416, 418, and 420 of the exemplary divider 600, according to one or more embodiments shown and described herein.

In particular, FIG. 6 depicts the first plurality of wick structures 210 arranged on the interior surface (e.g., the first cooling surface 208). In this embodiment, the first plurality of wick structures 210 are shown to be coupled to areas surrounding the vapor spaces 404 on a bottom surface of the divider 204. Additionally, two wick structures of the second plurality of 212 are shown to be coupled to areas surrounding the vapor spaces 404 on a top surface of an exemplary divider 600. There is no depiction, however, of the fluid chamber 122, the manifold 107, or the second interior surface (e.g., the second cooling surface 202).

The exemplary divider 600 varies from the divider 204 in that the exemplary divider 600 includes one or more exemplary divider supports 604 that extend from one or more bridging supports 414, 416, 418, and 420 to the one or more flow channels (e.g., contact the flow channels 422, 424, 426, and 428) present between the first plurality of wick structures 210 arranged on the first cooling surface 208 (an interior surface) of the fluid chamber 122 and onto the one or more second flow channels (e.g., contact the flow channels 512, 514, 516, and 518) between the second plurality of wick structures 212 arranged on the second cooling surface 202 (an interior surface). In embodiments, the one or more exemplary divider supports 604 extend in a direction that is downwards from the divider 204 to the flow channels 422, 424, 426, and 428 and upwards from the divider in a diametrically opposite direction towards the flow channels 512, 514, 516, and 518.

Structurally, the exemplary divider supports 604 have a substantially cuboid shape with a length that are comparable to the length of each of the first plurality of wick structures 210 and the second plurality of wick structures 212. In particular, as depicted in FIG. 6, the length side of the exemplary divider supports 604 runs parallel to and extend nearly the entire length of the side surfaces of the first plurality of wick structures 210 and the second plurality of wick structures 212, namely the side surfaces that are parallel to the flow channels 422, 424, 426, and 428, and 512, 514, 516, and 518. In addition, the width of these exemplary divider supports 604 is less that the flow channels 422, 424, 426, and 428 and flow channels 512, 514, 516, and 518. Also, the exemplary divider supports 604 are of a height such that the exemplary divider supports 604 do not extend and contact the flow channels 422, 424, 426, and 428, and 512, 514, 516, and 518, respectively. Such a height ensures that exemplary divider supports 604 do not compress or come in contact against the first cooling surface 208 and the second cooling surface 202 during vibration, gyration, or similar movement of the cooling assembly 100 or due to pressure disequilibrium on the sides of the bridging supports 414, 416, 418, and 420. in some embodiments, the vibration or gyration may be caused by movement of a vehicle in which the cooling assembly 100 is installed.

Due to the configuration of the exemplary divider supports 604 on the exemplary divider 600, there are spaces in the flow channels 422, 424, 426, and 428, and 512, 514, 516, and 518 such that the working fluid flows in directions 606, 608, 610, and 612, as depicted in FIG. 6, In particular, the working fluid flows through the gaps between the exemplary divider supports 604 and the flow channels 422, 424, 426, and 428, and 512, 514, 516, and 518, and additional gaps between the exemplary divider supports 604 and first plurality of wick structures 210 and the second plurality of wick structures 212. In this way, the cooling assembly 100 having the exemplary divider 600 enables effective operation of the cooling assembly 100 described.

The exemplary divider supports 604 also serve to increase the rigidity of the exemplary divider 600 such that the likelihood of deformation at various portions of the exemplary divider 600 is reduced. For example, the exemplary divider 600 (similar to the divider 204) may be made of rubber or of materials having similar malleability, tensile strength, and other properties that are comparable to rubber. As such, inclusion of exemplary divider supports 604 at various portions of the exemplary divider 600 increases the rigidity and durability of the exemplary divider 600.

Figure 7:
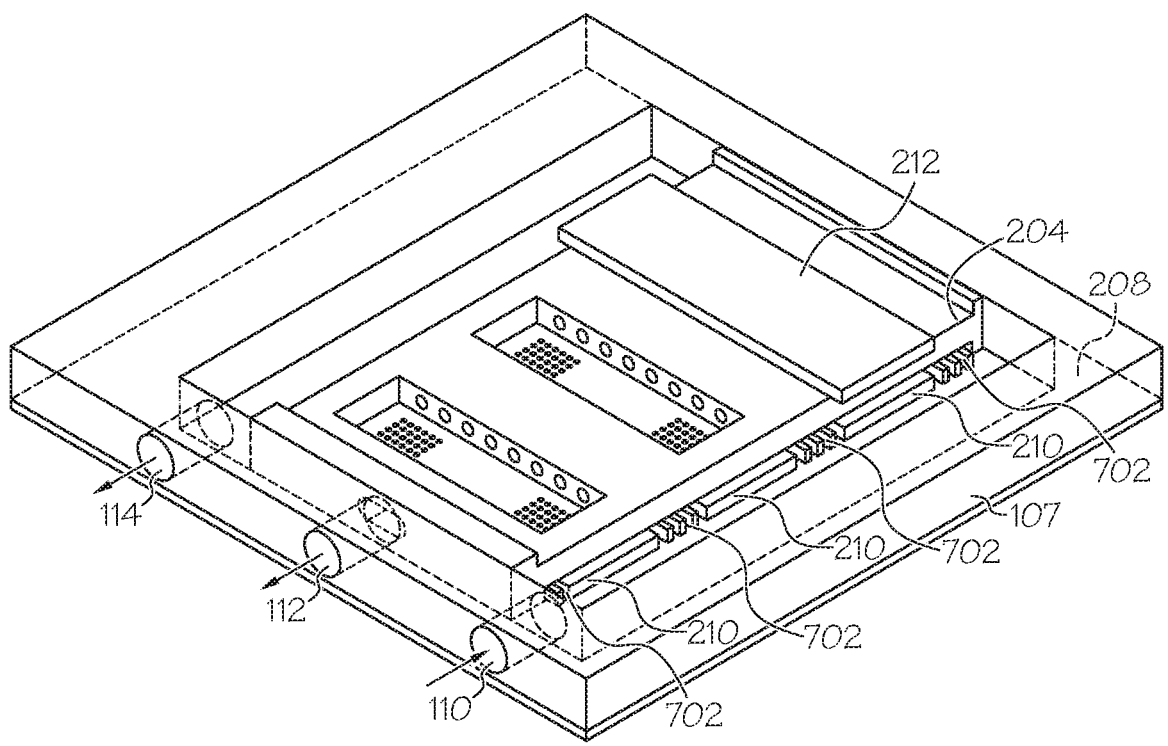
FIG. 7 schematically depicts a perspective view of a plurality of fin structures that are disposed within one or more flow channels present between a plurality of wick structures arranged upon an interior surface of the fluid chamber depicted in FIGS. 3 and 5, according to one or more embodiments shown and described herein.

FIG. 7 schematically depicts a perspective view of a plurality of fin structures 702 that are disposed within one or more flow channels (e.g., flow channels 422, 424, 426, and 428, and 512, 514, 516, and 518) present between a plurality of wick structures (the first plurality of wick structures 210 and the second plurality of wick structures 212) arranged upon an interior surface of the fluid chamber 122, according to one or more embodiments shown and described herein.

In particular, as depicted in FIG. 7, the plurality of fin structures 702 are coupled to or disposed on the flow channels 422, 424, 426, and 428 in batches of three. For example, the one or more fin structures 702 could include a unit of three individual components that are equally spaced from each other. Each of the fin structures 702 may be disposed on the flow channels 422, 424, 426, and 428, respectively. Such a configuration, as depicted in FIG. 7, still provides some space between the fin structures 702 and the side surfaces of the first plurality of wick structures 210, namely the side surfaces that are parallel to the 422, 424, 426, and 428. The working fluid may flow through the flow channels 422, 424, 426, and 428, namely in areas in between these fin structures 702 such that a cooling effect can be provided.

Structurally, the fin structures 702 could be configured or designed to include straight fins, pin fins, and/or the like. The fin structures 702 may be made of materials such as, e.g., aluminum, copper, and/or the like. The fin structures 702 have a cuboid shape with length that is comparable to length of the side surfaces of the first plurality of wick structures 210, namely the side surfaces that are parallel to the flow channels 422, 424, 426, and 428. However, the width of the fin structures 702 is significantly lower than that of the exemplary divider supports 604 depicted in FIG. 6. In embodiments, the height of the fin structures 702 may be such that each of the fin structures 702 may extend upwards from the first cooling surface 208 towards the divider 204, as shown in FIG. 7, and contact one or more bridging supports 414, 416, 418, and 420 of the divider 204. Alternatively, the height of the fin structures 702 are such that each of these may extend upwards from the first cooling surface 208 towards the divider 204, as shown in FIG. 7, but will not contact the divider 204. As such, there is sufficient space for the fluid to flow through the flow channels 422, 424, 426, and 428, namely in areas in between the fin structures 702. In both embodiments, sufficient space may exist for the working fluid to flow through the flow channels 422, 424, 426, and 428, namely in areas in between the fin structures 702. The fin structures 702 serve a plurality of other purposes such as providing support to the divider 204 so that the divider does not bend beyond a certain limit. Additionally, the fin structures 702 enable the distribution of working fluid flow into the first plurality of wick structures 210 and enhance the single-phase cooling.

Figure 8:
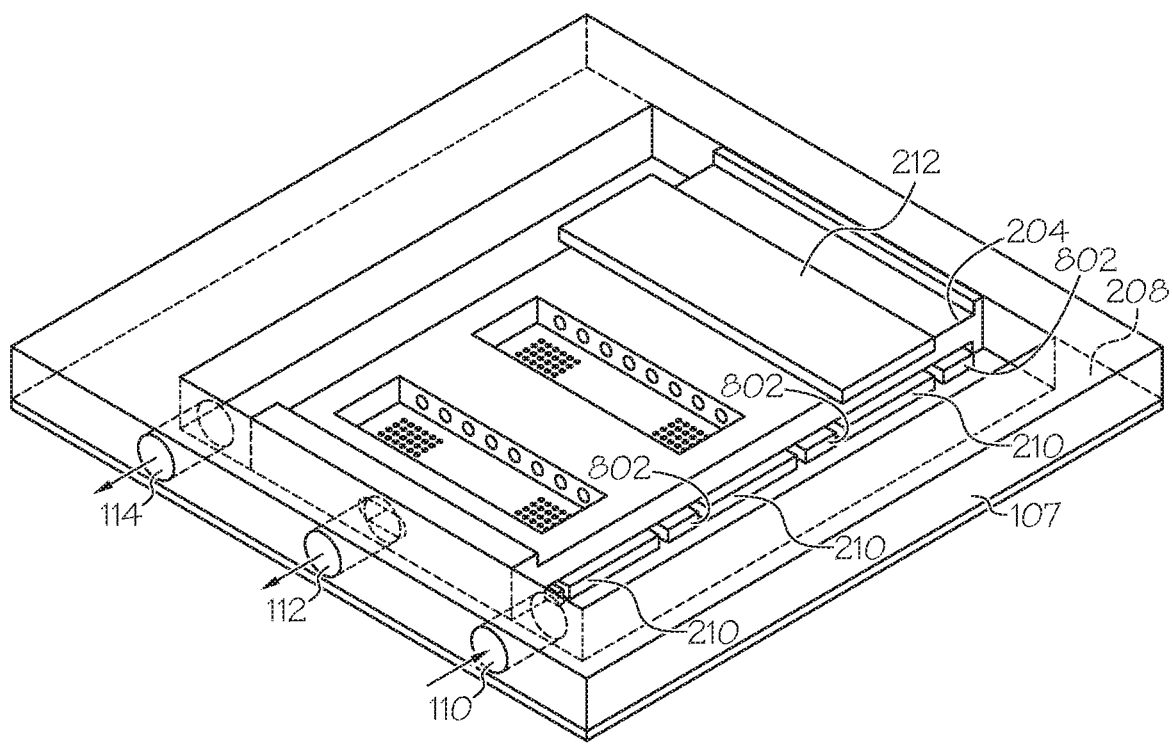
FIG. 8 schematically depicts a perspective view of a plurality of rib supports that are disposed within one or more flow channels present between a plurality of wick structures arranged upon an interior surface of the fluid chamber depicted in FIG. 5, according to one or more embodiments shown and described herein.

FIG. 8 schematically depicts a perspective view of a plurality of rib supports 802 that are disposed within one or more flow channels (422, 424, 426, and 428 and 512, 514, 516, and 518) present between a plurality of wick structures (the first plurality of wick structures 210 and the second plurality of wick structures 212) arranged upon an interior surface of the fluid chamber 122 depicted in FIG. 5, according to one or more embodiments shown and described herein.

In particular, FIG. 8 depicts a perspective view of an embodiment of the cooling assembly 100 described herein including the plurality of rib supports 802 disposed within the flow channels 424, 426, and 428 that are present between the first plurality of wick structures arranged on the first cooling surface 208 and extend between the bridging supports 422, 424, 426, and 428 to the first cooling surface 208 (e.g., an interior surface). As depicted, one or more of the rib supports 802 is depicted as being disposed in each of the flow channels 424, 426, and 428. The rib supports 802 extend between the one or more bridging supports 414, 416, 418, and 420 into the one or more flow channels (422, 424, 426, and 428 and 512, 514, 516, and 518).

Structurally, the rib supports 802 may have a cuboid shape with length that is comparable to length of the side surfaces of the first plurality of wick structures 210 (e.g., the side surfaces that define the flow channels 422, 424, 426, and 428). The width of each of the rib supports 802 is less than the width of each of the flow channels 422, 424, 426, and 428 present between the first plurality of wick structures 210. Also, in embodiments, the height of each of the rib supports 802 is such that each of the rib supports 802 may extend upwards from the first cooling surface 208 towards the divider 204, as shown in FIG. 8, and contact one or more bridging supports 414, 416, 418, and 420 of the divider 204. Even so, there is sufficient space for the working fluid to flow through the flow channels 422, 424, 426, and 428, namely in areas adjacent to the sides of the rib supports 802. Alternatively, the height of each of the rib supports 802 is such that each of the rib supports 802 may extend upwards from the first cooling surface 208 towards the divider 204, as shown in FIG. 8, but will not contact the divider 204. As such, there is sufficient space for the fluid to flow through the flow channels 422, 424, 426, and 428, namely in areas in between the rib supports 802. In embodiments, the rib supports 802 may made of materials such as, e.g., aluminum or copper or metals having properties comparable to aluminum and copper. In yet other embodiments, the rib supports 802 may be formed as extensions that protrude from the fluid chamber 122, and as such, may be made of the same materials as the surface (e.g., the first cooling surface 208 and the second cooling surface 202) of the fluid chamber 122. Similar to the fin structures 702, the rib supports 802 help prevent the bending of the divider 204 while enabling the distribution of working fluid flow to the first plurality of wick structures 210.

Figure 9:
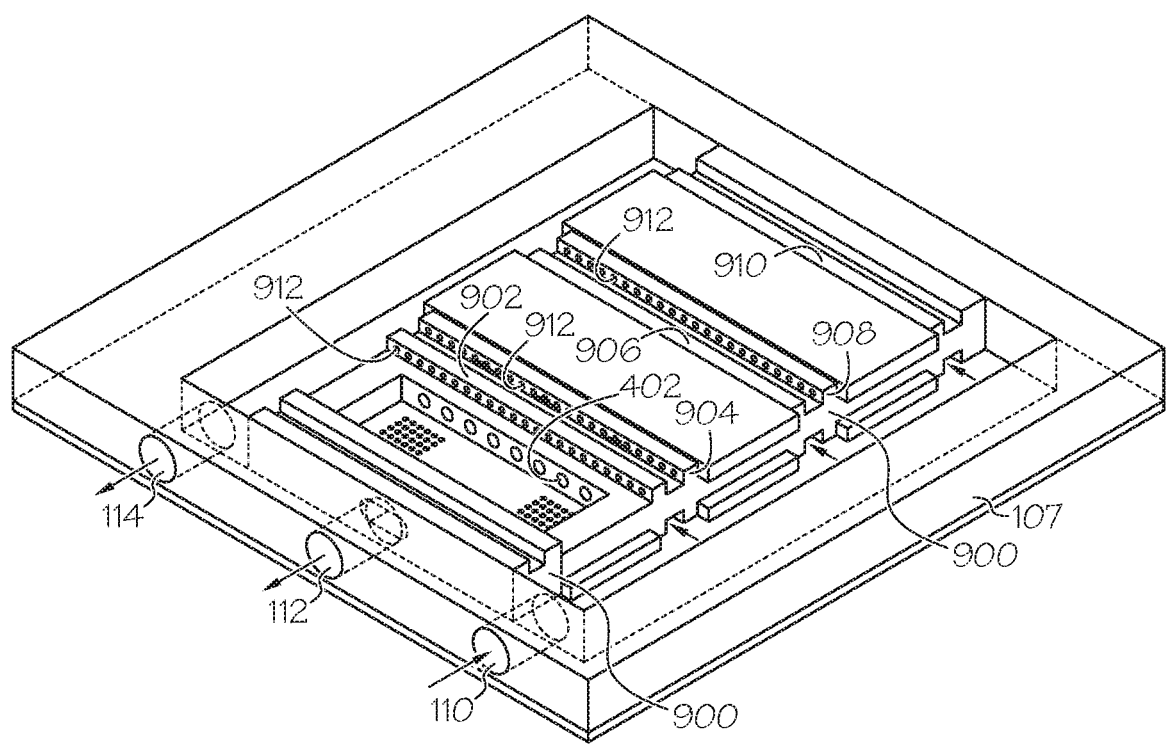
FIG. 9 schematically depicts a perspective view of an embodiment of an exemplary divider having a plurality of divider supports that extend from one or more bridging supports of the exemplary divider, according to one or more embodiments shown and described herein.

FIG. 9 schematically depicts a perspective view of an embodiment of an exemplary divider 900 having a plurality of flow dividers 902, 904, 906, 908, and 910 that extend from one or more bridging supports 414, 416, 418, and 420 of the exemplary divider 900 into one or more flow channels (e.g., the flow channels 422, 424, 426, and 428 present between the first plurality of wick structures 210 and the flow channels 512, 514, 516, and 518 present between the second plurality of wick structures 212), according to one or more embodiments shown and described herein.

In particular, in FIG. 9, the first plurality of wick structures 210 are shown to be coupled to areas surrounding the vapor spaces 404 on a bottom surface of an exemplary divider 900. Additionally, two wick structures of the second plurality of 212 are shown to be coupled to areas surrounding the vapor spaces 404 on a top surface of the exemplary divider 900. There is no depiction, however, of the fluid chamber 122, the manifold 107, or the second interior surface (e.g., the second cooling surface 202).

In embodiments, the one or more flow dividers 902, 904, 906, 908, and 910 of the exemplary divider 900 extend in a direction that is downwards from the one or more bridging supports 414, 416, 418, and 420 towards the flow channels 422, 424, 426, and 428 present on the first plurality of wick structures 210. Similarly, the one or more flow dividers 902, 904, 906, 908, and 910 also extend upwards from the one or more bridging supports 414, 416, 418, and 420 in a diametrically opposite direction towards the flow channels 512, 514, 516, and 518 (not shown) that are present on the second plurality of wick structures 212 (partially shown).

Structurally, the flow dividers 902, 904, 906, 908, and 910 have a substantially cuboid shape with a length that are comparable to the length of each of the first plurality of wick structures 210 and the second plurality of wick structures 212. In particular, as depicted in FIG. 9, the length side of the exemplary divider supports 604 runs parallel to and extends nearly the entire length of the side surfaces of the first plurality of wick structures 210 and the second plurality of wick structures 212, namely the side surfaces that are parallel to the flow channels 422, 424, 426, and 428, and 512, 514, 516, and 518 (not shown).

In addition, the width of these flow dividers 902, 904, 906, 908, and 910 is less that the flow channels 422, 424, 426, and 428 and flow channels 512, 514, 516, and 518. The height of these flow dividers 902, 904, 906, 908, and 910 is such that these flow dividers 902, 904, 906, 908, and 910 extend and contact the flow channels 422, 424, 426, and 428, and 512, 514, 516, and 518, respectively. The flow dividers 902, 904, 906, 908, and 910 are each also defined with a plurality of liquid feeding ports 912.

Due to this configuration, there are spaces in the flow channels 422, 424, 426, and 428, and 512, 514, 516, and 518 through which the working fluid flows. Additionally, as the working fluid flows through these channels (422, 424, 426, and 428, and 512, 514, 516, and 518), the working fluid also enters through the liquid feeing ports 912 defined in each of the flow dividers 902, 904, 906, 908, and 910 such that a plurality of side surfaces of the first plurality of wicks structures 210 and the second plurality of wick structures 212, namely the side surfaces that are parallel to the flow channels 422, 424, 426, and 428, and 512, 514, 516, and 518, are at least partially contacted. In this way, the exemplary divider 900 enables effective operation of the cooling assembly 100 described herein.

The flow dividers 902, 904, 906, 908, and 910 may increase the durability of the exemplary divider 900 such that the likelihood of deformation at various portions of the exemplary divider 900 is reduced. For example, the exemplary divider 900 (similar to the divider 204) may be made of rubber or of materials having similar malleability, tensile strength, and other properties that are comparable to rubber. As such, inclusion of flow dividers 902, 904, 906, 908, and 910 at various portions of the exemplary divider 600 increases the rigidity and durability of the exemplary divider 900, while reducing the likelihood of flooding of the first plurality of wick structures 210 and the second plurality of wick structures 212, e.g., by managing the amount of working fluid that contacts the side surfaces of the first plurality of wick structures 210 and the second plurality of wick structures 212 via the liquid feeding ports 912.

It should now be understood that the embodiments described herein are directed to various configurations of a power device embedded PCB that is coupled to a surface of a cooling assembly and a capacitor included in an enclosure that is coupled to another surface of the cooling assembly. In embodiments, the cooling assembly may include a housing defining a fluid chamber, a plurality of wick structures, and a divider. The divider may include an outer frame comprising a first side and a second side, and one or more bridging supports extending between and connecting the first side and the second side of the outer frame. The one or more bridging supports may be aligned with the one or more flow channels between the plurality of wick structures. Each one of the one or more bridging supports may define a plurality of vapor flow paths extending therethrough. The one or more bridging supports may further define a plurality of vapor spaces between the one or more bridging supports that are aligned with the plurality of wick structures. The plurality of vapor flow paths are fluidly coupled to the vapor spaces.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling assembly, comprising:
a housing defining a fluid chamber;
a manifold disposed within the fluid chamber defining an inlet, an outlet, and a vapor outlet;
a plurality of wick structures arranged on an interior surface of the fluid chamber such that one or more flow channels are present between the plurality of wick structures; and
a divider comprising:
an outer frame comprising a first side and a second side, and
one or more bridging supports extending between and connecting the first side and the second side of the outer frame, the one or more bridging supports aligned with the one or more flow channels between the plurality of wick structures, the one or more bridging supports defining:
a plurality of vapor spaces between the one or more bridging supports that are aligned with the plurality of wick structures, and,
wherein the vapor outlet is fluidly coupled to the divider and disposed between the inlet and the outlet such that fluid enters the fluid chamber via the inlet and evaporates from the plurality of wick structures to vapor, the vapor exits the divider via the vapor outlet, and a remainder of the fluid exits the fluid chamber via the outlet.

2. The cooling assembly of claim 1, further comprising:
a second plurality of wick structures arranged on a second interior surface facing the interior surface of the fluid chamber such that one or more second flow channels are present between the second plurality of wick structures,
wherein the divider is arranged such that the one or more bridging supports are aligned with the one or more second flow channels.

3. The cooling assembly of claim 1, wherein:
the manifold defines an interior void, and
the divider is disposed within the interior void of the manifold.

4. The cooling assembly of claim 3, wherein the inlet and the outlet are fluidly coupled to the interior void.

5. The cooling assembly of claim 1, wherein the divider further comprises a plurality of vapor flow paths laterally extending through each one of the one or more bridging supports to fluidly couple the vapor spaces together.

6. The cooling assembly of claim 1, wherein the outer frame of the divider comprises a vapor port that is fluidly coupled to the plurality of vapor spaces and a plurality of vapor flow paths that extend through each one of the one or more bridging supports, and the vapor port is aligned with the vapor outlet of the manifold.

7. The cooling assembly of claim 1, wherein:
the outer frame of the divider comprises a first end support and a second end support, and
the first side and the second side extend between and connect the first end support and the second end support.

8. The cooling assembly of claim 1, wherein the divider further comprises one or more divider supports extending from the one or more bridging supports into the one or more flow channels.

9. The cooling assembly of claim 8, wherein the one or more divider supports contact the interior surface of the fluid chamber.

10. The cooling assembly of claim 1, further comprising one or more fin structures disposed within the one or more flow channels between the plurality of wick structures.

11. The cooling assembly of claim 1, further comprising one or more rib supports disposed within the one or more flow channels between the plurality of wick structures, the one or more rib supports extending between the one or more bridging supports and the interior surface of the fluid chamber.

12. The cooling assembly of claim 1, wherein the divider further comprises one or more flow dividers extending from the one or more bridging supports into the one or more flow channels, the one or more flow dividers defining a plurality of liquid feeding ports therethrough.

13. The cooling assembly of claim 1, wherein the interior surface of the fluid chamber is a single-phase cooling surface or a two-phase cooling surface.

14. The cooling assembly of claim 1, wherein the interior surface of the fluid chamber is a two-phase cooling surface and a second interior surface of the fluid chamber facing the interior surface is a single-phase cooling surface or a non-cooling surface.

15. A cooling assembly, comprising:
a housing defining a fluid chamber having a first interior surface and a second interior surface facing the first interior surface;
a manifold disposed within the fluid chamber defining an inlet, an outlet, and a vapor outlet;
a first plurality of wick structures arranged on the first interior surface of the fluid chamber such that one or more first flow channels are present between the first plurality of wick structures;
a second plurality of wick structures arranged on the second interior surface of the fluid chamber such that one or more second flow channels are present between the second plurality of wick structures; and
a divider disposed between the first interior surface and the second interior surface of the fluid chamber, the divider comprising:
an outer frame comprising a first side and a second side, and
one or more bridging supports extending between and connecting the first side and the second side of the outer frame, the one or more bridging supports aligned with the one or more first flow channels and the one or more second flow channels, each one of the one or more bridging supports defining a plurality of vapor flow paths extending therethrough,
wherein the vapor outlet is fluidly coupled to the divider and disposed between the inlet and the outlet such that fluid enters the fluid chamber via the inlet and evaporates from the plurality of wick structures to vapor, the vapor exits the divider via the vapor outlet, and a remainder of the fluid exits the fluid chamber via the outlet.

16. The cooling assembly of claim 15, wherein:
the manifold defines an interior void, and
the divider is disposed within the interior void of the manifold.

17. The cooling assembly of claim 15, further comprising one or more divider supports extending from the one or more bridging supports into the one or more first flow channels and the one or more second flow channels.

18. A cooling system, comprising:
a power device; and
a cooling assembly thermally coupled to the power device, the cooling assembly comprising:
a housing defining a fluid chamber;
a manifold disposed within the fluid chamber defining an inlet, an outlet, and a vapor outlet;
a plurality of wick structures arranged on an interior surface of the fluid chamber such that one or more flow channels are present between the plurality of wick structures; and
a divider comprising:
an outer frame comprising a first side and a second side, and
one or more bridging supports extending between and connecting the first side and the second side of the outer frame, the one or more bridging supports aligned with the one or more flow channels between the plurality of wick structures, the one or more bridging supports defining:
a plurality of vapor spaces between the one or more bridging supports that are aligned with the plurality of wick structures, and
a plurality of vapor flow paths that fluidly couple the vapor spaces together,
wherein the vapor outlet is fluidly coupled to the divider and disposed between the inlet and the outlet such that fluid enters the fluid chamber via the inlet and evaporates from the plurality of wick structures to vapor, the vapor exits the divider via the vapor outlet, and a remainder of the fluid exits the fluid chamber via the outlet.

19. The cooling system of claim 18, further comprising a capacitor, wherein the cooling assembly is disposed between the capacitor and the power device.

20. The cooling system of claim 18, wherein the power device is embedded within a printed circuit board (PCB).

* * * * *

UNITED STATES PATENT AND TRADEMARK OFFICE
CERTIFICATE OF CORRECTION

| | |
|---|---|
| PATENT NO. | : 11,802,739 B2 |
| APPLICATION NO. | : 17/009246 |
| DATED | : October 31, 2023 |
| INVENTOR(S) | : Feng Zhou et al. |

It is certified that error appears in the above-identified patent and that said Letters Patent is hereby corrected as shown below:

In the Specification

In Column 10, Line(s) 35, delete "convenience" and insert --convenient--, therefor.

In Column 12, Line(s) 64, delete "that" and insert --than--, therefor.

In Column 15, Line(s) 50, delete "that" and insert --than--, therefor.

Signed and Sealed this
Second Day of January, 2024

Katherine Kelly Vidal
*Director of the United States Patent and Trademark Office*